United States Patent [19]

Christopher

[11] Patent Number: 4,819,252
[45] Date of Patent: Apr. 4, 1989

[54] SAMPLED DATA SUBSAMPLING APPARATUS

[75] Inventor: Todd J. Christopher, Indianapolis, Ind.

[73] Assignee: Thomson Consumer Electronics, Inc., Indianapolis, Ind.

[21] Appl. No.: 155,944

[22] Filed: Feb. 16, 1988

[51] Int. Cl.$^4$ ............................................. H04B 1/66
[52] U.S. Cl. .................................. 375/122; 375/103; 364/724.1
[58] Field of Search ...................... 375/25, 26, 27, 30, 375/96, 122, 103; 364/724, 825; 381/29-31

[56] References Cited

U.S. PATENT DOCUMENTS

| | | | |
|---|---|---|---|
| 4,032,885 | 6/1977 | Roth | 375/96 |
| 4,270,026 | 5/1981 | Shenoi et al. | 375/122 |
| 4,320,519 | 3/1982 | Kelley et al. | 375/26 |
| 4,385,393 | 5/1983 | Chavre et al. | 375/30 |
| 4,704,600 | 11/1987 | Uchimura et al. | 340/347 |
| 4,727,506 | 2/1988 | Fling | 375/26 |
| 4,733,403 | 3/1988 | Simone | 375/122 |

OTHER PUBLICATIONS

J. C. Candy et al., "A Voiceband Codec with Digital Filtering", IEEE Trans. on Communications, vol. Com-29, No. 6, Jun. 1981, pp. 815-830.
J. C. Candy, "Decimation for Sigma Delta Modulation", IEEE Transaction on Communications, vol. Com-34, No. 1, Jan. 1986, pp. 72-76.
J. C. Candy, "A Use of Double Integration in Sigma Delta Modulation," IEEE Trans. on Communications, vol. Com-33, No. 3, Mar. 1985, pp. 249-258.
N. Kouvaras et al., "Realisation of Nonrecursive Delta-Modulation Filters Using Look-Up Tables" IEEE Proceedings, vol. 134, Pt.G, No. 3, June 8; pp 127-131.

Primary Examiner—Robert L. Griffin
Assistant Examiner—Stephen Chin
Attorney, Agent, or Firm—E. M. Whitacre; P. J. Rasmussen; E. P. Herrmann

[57] ABSTRACT

An antialias filtering and subsampling system incorporates a compound accumulator including three cascade connected accumulator circuits conditioned to integrate and dump the integrated values of n input samples. The integrated values from the three integrators are scaled, delayed and combined to produce substampled values of a signal which has been filtered according to the transfer function $[\sin(n\pi ft)/n\sin(\pi ft)]^3$.

12 Claims, 5 Drawing Sheets

SAMPLED DATA SUBSAMPLING APPARATUS

The present invention is directed toward apparatus for reducing the rate of samples of a sampled data signal.

Frequently sampled data representations of an analog signal are generated at a particular sample rate but for various reasons are processed at a lower rate. An example of such a system is a digital audio processor. In order to convert an analog audio signal to a digital representation thereof with high precision, but with relatively simple circuitry, sigma-delta converters are implemented. However, in order to achieve the desired precision the sigma-delta converter sample rate must be orders of magnitude greater than the audio frequencies. It is not practical nor necessary to process the converted audio signals at the high sample frequencies and so the converted signals are subsampled before processing. However, before subsampling, it is necessary to filter the converted signal in order to preclude aliasing of high frequency noise into the baseband signal. In addition, it is desirable to convert the sigma-delta converted samples, which are single-bit samples into multi-bit binary samples so that they may be processed using the more conventional binary digital circuitry.

It has been recognized that the process of filtering and subsampling may be performed by accumulating the values of a predetermined number or samples, and dumping the accumulated values at particular intervals. The dumped accumulated values form the filtered, subsampled signal. James C. Candy et al. in the article "A Voiceband Codec with Digital Filtering", IEEE Transaction on Comnunications, Vo. COM-29, No. 6, June 1981, pp. 815–830 describe an audio system which oversamples and then decimates (subsamples) before processing. Filtering and subsampling is performed by first performing a double accumulation and dump, which is followed by low pass filtering, and then performing a further accumulate and dump function. The Candy et al. apparatus performs the double accumulate and dump function on the higher data rate signal using parallel-bit processing elements which are conducive to dumping an accumulated value in one sample period and thereby permitting continuous processing of the incoming sampling. However, parallel-bit processing elements tend to require significant numbers of devices.

Bit-serial processing elements nominally require significantly fewer devices than parallel-bit elements to perform like processing functions. Thus bit-serial devices advantageously tend to facilitate integrating complete systems on single integrated circuits. For example, a complete TV stereo audio processing system may be integrated in a single silicon die. However bit-serial devices tend not to be conducive to performing high rate accumulate and dump functions because of the time required to read out or dump an accumulated value. For example, consider a sigma-delta single bit signal occurring at a bit rate of 10 MHz, and that it is desired to subsample by a factor of 100. Sample accumulate and dump decimation requires adding successive subsets of 100 samples to form seven-bit samples at a 100 KHz rate. However, it should be appreciated that seven sample intervals of the input signal are required to dump the seven-bit accumulated values from the bit-serial accumulator. In principle, compound accumulate and dump decimation will require a larger number of sample intervals to output accumulated values. During the output intervals there will be contention between the accumulate and the dump functions.

The present invention has as an object, to provide a simplified subsampling system over the Candy et al. system and further to realize the system in bit-serial architecture.

SUMMARY OF THE INVENTION

The present invention is a subsampling system including a compound accumulation apparatus. A plurality of accumulator circuits are arranged in cascade connection. At predetermined intervals the accumulated values in each of the accumulator circuits are scaled, delayed by multiples of such intervals and combined to form a subsampled signal. In one embodiment of the invention, the cascade connection of accumulators is realized with adders and latches arranged for pipelined processing to eliminate contention between the accumulate and the dump function.

DETAILED DESCRIPTION

Figure 1:
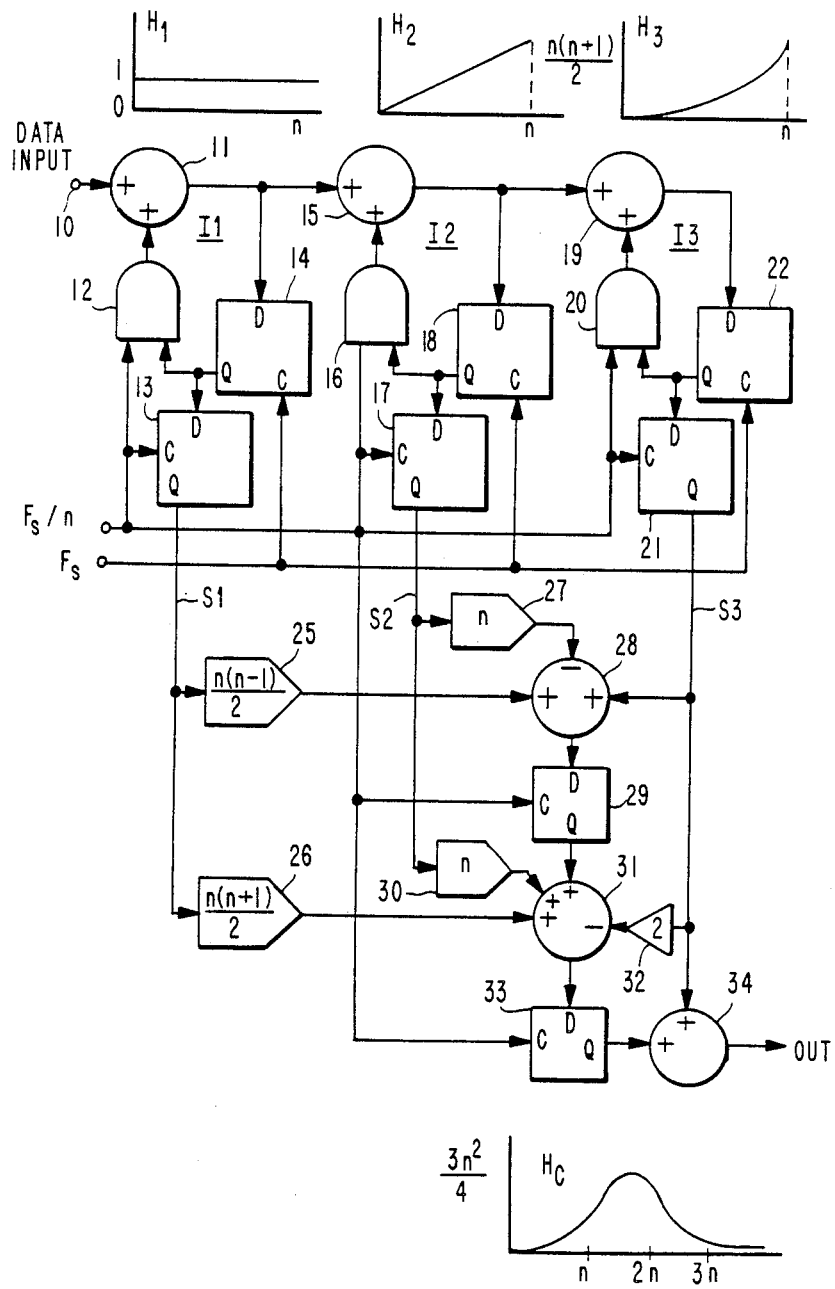
FIG. 1 is a schematic logic diagram of a filtering and subsampling system embodying the invention.

Oversampling as a means for converting between analog and digital signals permits conversion of the samples with lesser accuracy at the expense of processing at higher data rates. The high rate samples may then be subsampled to facilitate further processing of the converted samples. In order not to suffer a loss in signal resolution, the subsampled signal is nominally formed with samples of higher resolution (i.e., bit width) than the original samples. That is, the apparent quantization error of the subsampled signal is less than that of the oversampled samples. If the oversampled signal was simply decimated to generate a lower rate signal, the greater quantization error of the oversampled signal would manifest itself in the reduced rate signal as quantization noise aliased into the baseband signal. The quantization noise spectrum, of, for example, the output signal of a double loop sigma-delta converter, increases with frequency with an amplitude proportional to the square of frequency. The quantization noise may be sufficiently reduced to preclude such aliasing by filtering the oversampled signal with a filter having the transfer function $H_c(f)$ given by $$H_c(f) = k\left(\frac{\sin(n\pi fT)}{n\sin(\pi fT)}\right)^3 \quad (1)$$

where T is the period of the oversampling rate $f_s$. The form of the impulse response of this function is indicated in FIG. 1 adjacent the output connection OUT. The inventor discovered that this transfer function may be generated with a piecewise linear combination of samples from a compound accumulator. Specifically, the samples of three cascade accumulators, which sum exclusive groups of n samples of the oversampled signals, are appropriately scaled, delayed and combined to realize the function.

Referring to FIG. 1, the illustrated circuitry may be configured to process input samples of any bit width with the appropriate selection of circuit elements. Therefore, the FIG. 1 circuit in general can process either single-bit input samples or plural-bit input samples. The circuitry performs accumulations of input samples, hence the output samples will nominally be of greater bit-width than the input samples, which output samples may be truncated as desired. In FIG. 1 assume that the respective elements are designed to accommodate plural bit samples, for example adder 11 and latches 13 and 14 will be selected to have sufficient bit width to process or store a value equal to nx where n is the number of samples accumulated and x is the maximum value that the input sample can assume; adder 15 and latches 17 and 18 will be selected to have a bit width to process or store a value equal to x·n(n+1)/2; and adder 19 and latches 21 and 22 will be selected to have sufficient bit width to process or store a value equal to x·n(n+1)(n+2)/6.

The circuitry includes three cascaded accumulators I1, I2, and I3, and the form of their respective impulse response $H_1$, $H_2$ and $H_3$ is indicated on the drawing. Accumulator I1 is arranged to sum exclusive groups of n input samples applied to terminal 10. Accumulator I2 adds exclusive groups of n successive sums provided by accumulator I1 and accumulator I3 adds exclusive groups of n successive sums provided by accumulator I2. Accumulator I1 includes an adder 11 having a first input connection coupled to input terminal 10 and a second input connection coupled via gating circuit 12 to the output connection of storage element 14. The output connection of adder 11 is coupled to the input connection of accumulator I2 and to the data input connection of storage element 14. The storage element 14 successively provides the lastmost generated sum provided by adder 11 to the second input of adder 11 to be added to the current sample occurring on terminal 10. Input samples occur at terminal 10 at a rate $f_s$ synchronous with a clocking signal $F_s$ which controls the storage element 14. The gating circuit 12 is conditioned by a control signal $F_s/n$, having a frequency of $f_s/n$, to pass the output provided by storage element 14 to adder 11 for n−1 consecutive periods of clock signal $F_s$, i.e. for n−1 input samples. During the first sample period of each grouping of n input samples, gating circuit 12 provides a zero value to the second input connection of adder 11 thereby effectively resetting the accumulated value to zero. A further storage element 13 coupled to the output connection of storage element 14 is simultaneously conditioned by the signal $F_s/n$ to store the accumulated value of the n lastmost occurring input samples. Accumulators I2 and I3 are constructed similarly and function in identical fashion with accumulator I1.

Storage element 13 provides samples S1 at the rate of $f_s/n$, which represent the sums S1 of exclusive groups of n input samples. The sums S1 are given by the equation $$S1 = \sum_{i=1}^{n} x_i \quad (2)$$

where $x_i$ is the value of the exclusive group of n input samples.

Storage element 17 provides samples S2, which are generated by accumulator I2, at the rate $f_s/n$. The values of the samples S2 are given by $$S2 = \sum_{i=1}^{n} (n - i + 1)x_i \quad (3)$$

which correspond to linearly weighted sums of input samples.

Storage element 21 provides samples S3, which are generated by accumulator I3, at the rate $f_s/n$. The values of the samples S3 are given by $$S3 = \tfrac{1}{2} \sum_{i=1}^{n} (n - i + 1)(n - i + 2)x_i \quad (4)$$

which correspond to quadratically weighted sums of input samples.

Since the accumulators I1, I2 and I3 integrate and dump every n input samples, their respective impulse responses H1, H2 and H3 only extend over n samples. The impulse response of the desired transfer function $H_c$, however, is seen to encompass 3n samples. In order to realize this transfer function (impulse response) it is therefore necessary to incorporate 3n samples in the output sample. This is accomplished by combining sums S1, S2 and S3 corresponding to three successive groups of n input samples. Specifically, the transfer function $H_c$ is realized by combining the current signal S3 with the samples S1,S2,S3 occurring immediately prior to the current samples in the ratio n(n+1)/2:n:−2 and also with the samples S1,S2,S3 occurring two subsample periods before the current sample in the ratio n(n−1)/2:−n:1. In conventional "Z" transform notation the output samples $S_o$ are given by the equation $$S_o = S3 + (S1n(n+1)/2 + nS2 - 2S3)Z^{-1} + (s1n(n-1)/2 - nS2 + S3)Z^{-2} \quad (5)$$

where $Z^{-1}$ represents a delay period of n input sample periods or one subsample period.

The combining function is performed by elements 25–34. Signal S1 is applied to weighting elements 25 and 26 wherein it is scaled by the factors n(n−1)/2 and n(n+1)/2 respectively. Signal S2 is applied to weighting elements 27 and 30 wherein it is scaled by the factor n. Signal S3 is applied to weighting element 32 wherein it is scaled by the factor 2. Signal S3, signal S2 scaled by n in element 27 and signal S1 scaled by n(n−1)/2 in element 25 are combined in combining element 28 which produces combined signal S3−nS2+(n(n−1)/2)S1. This combined signal is coupled to delay element 29 which delays the combined signal by one subsample period producing the signal (S3−nS2+S1n(n−1)/2)Z⁻¹. The combined and delayed sample from delay element 29, signal S3 scaled by 2 in element 32, signal S2 scaled by n in element 30 and signal S1 scaled by n(n+1)/2 in element 26 are combined in combining circuit 31 to produce the signal $$(S3-nS2+S1n(n-1)/2)Z^{-1}-2S3+nS2+S1n(n+1)/2 \quad (6)$$

This signal is coupled to delay element 33, and delayed therein by one subsample period. The output of delay element 33 is combined with signal S3 in adder 34 to generate the desired signal defined by equation (5).

It will be appreciated by those skilled in the art of circuit design that the elements comprising the accumulators must operate at the oversampling rate. The remainder of the circuitry, however, operates at the lower subsample rate, lessening the design constraints on these circuit elements.

Figure 2:
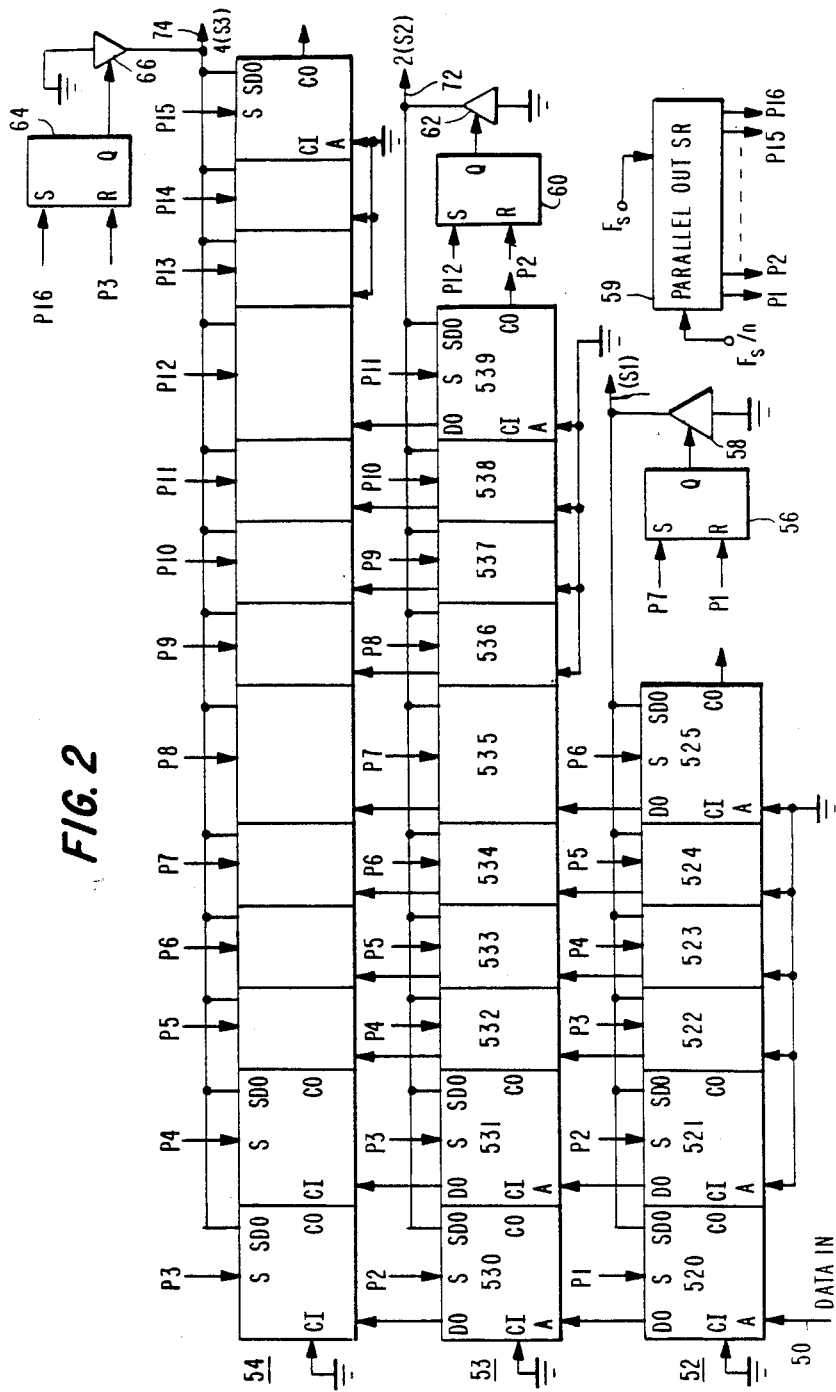
FIG. 2 is a block diagram of a pipelined compound accumulator embodying another aspect of the invention.
Figure 3:
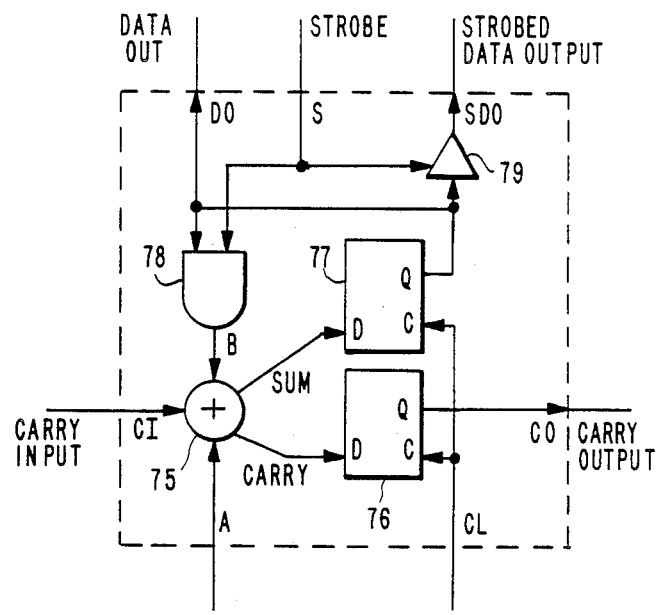
FIG. 3 is a logic schematic diagram of one cell of the accumulator apparatus illustrated in FIG. 2.
Figure 4:
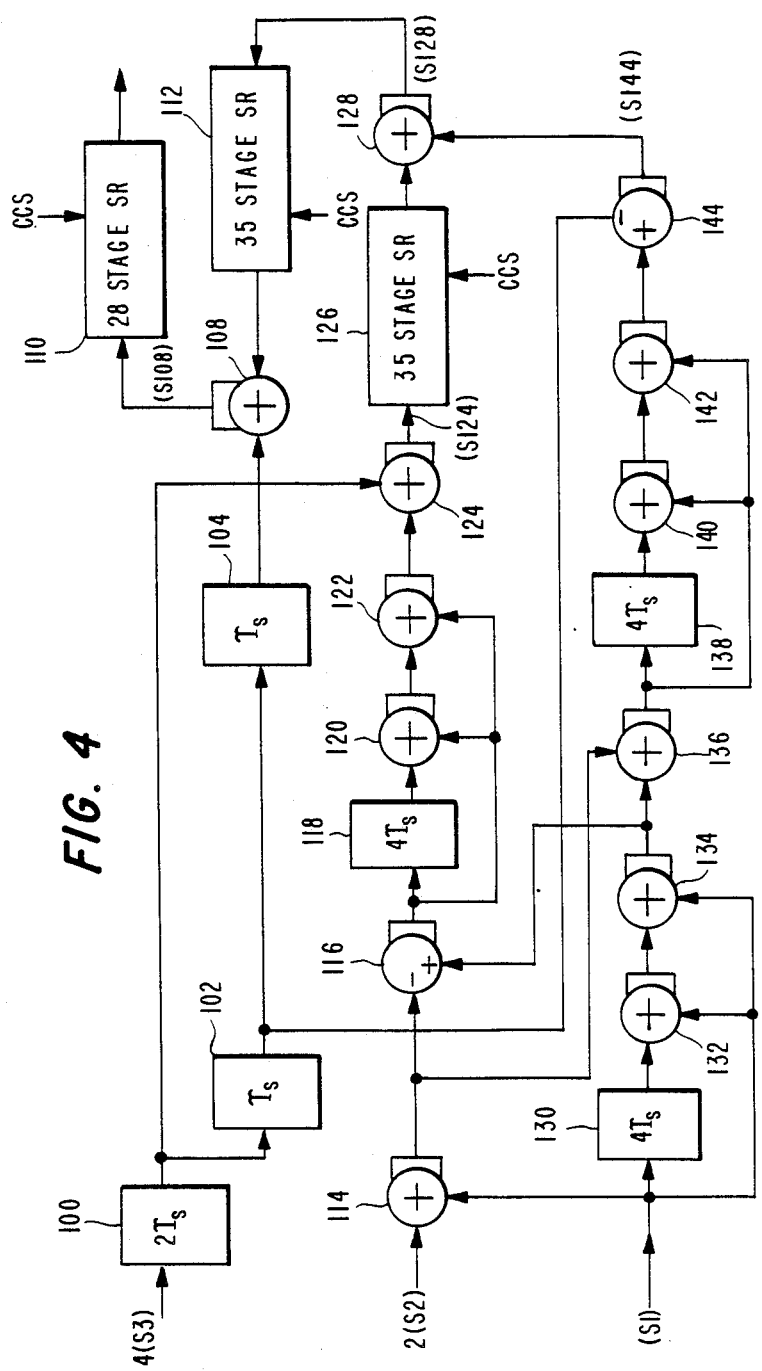
FIG. 4 is a logic schematic diagram of bit-serial circuitry for scaling and combining samples provided by the FIG. 2 apparatus, to produce filtered and subsampled binary samples.

The system shown in FIGS. 2-4 is a particularly advantageous arrangement for performing the filtering and decimation process using bit-serial devices. FIG. 2 illustrates a bit-serial pipelined, compound accumulator which generates three accumulated sums from single bit oversampled input samples. The FIG. 2 apparatus generally corresponds to the accumulators I1, I2 and I3 of FIG. 1, however the respective outputs that are provided are S1, 2S2 and 4S3 rather than S1,S2 and S3.

In FIG. 2 the oversampled signal applied at terminal 50 is coupled to an element 52 which includes a plurality (here 6) of one bit adder circuits. The adder circuits are identical and are illustrated in detail in FIG. 3. Each adder circuit includes a summing circuit 75 having an external addend input terminal, A, an internal augend input terminal, B, and a carry input terminal, CI. The summing circuit provides a one bit sum output, which is coupled to the data input, D, of a clocked latch 77, and a carry output which is coupled to the data input of a clocked latch 76. Latches 76 and 77 have respective clock input terminals, CL, to which a clock signal, $F_s$, having a clock rate of $f_s$ is applied. The sum output and the carry output are thus delayed by one period of the clock $f_s$ and respectively coupled to the data output terminal DO and the carry output terminal CO. The delayed sum output from latch 77 is also coupled to a gated buffer 79 and to the augend input terminal, B, via AND gate 78. An externally generated strobe signal is coupled to a strobe input terminal, S. The strobe input terminal is coupled to the control input terminal of the gated buffer and to a second input terminal of the AND gate 78. The strobe signal is maintained low during one sample period of n sample periods and held high for the remaining sample periods of each group of n sample periods. A low value strobe signal conditions the gated buffer 79 to couple the current value held in latch 79 to a strobed data output terminal SDO. A high valued strobe signal conditions the gated buffer 79 to exhibit a high impedance output to terminal SDO. A low valued strobe signal conditions the AND gate 78 to apply a zero value to the augend input terminal, B, effectively resetting the adder circuit. This occurs once every n input sample periods. A high valued strobe signal conditions the AND gate 78 to apply the delayed sum output from latch 77 to the augend input terminal B. This occurs for n−1 periods of each successive group of n input sample periods, during which time the adder circuit operates as a one bit accumulator.

Figure 5:
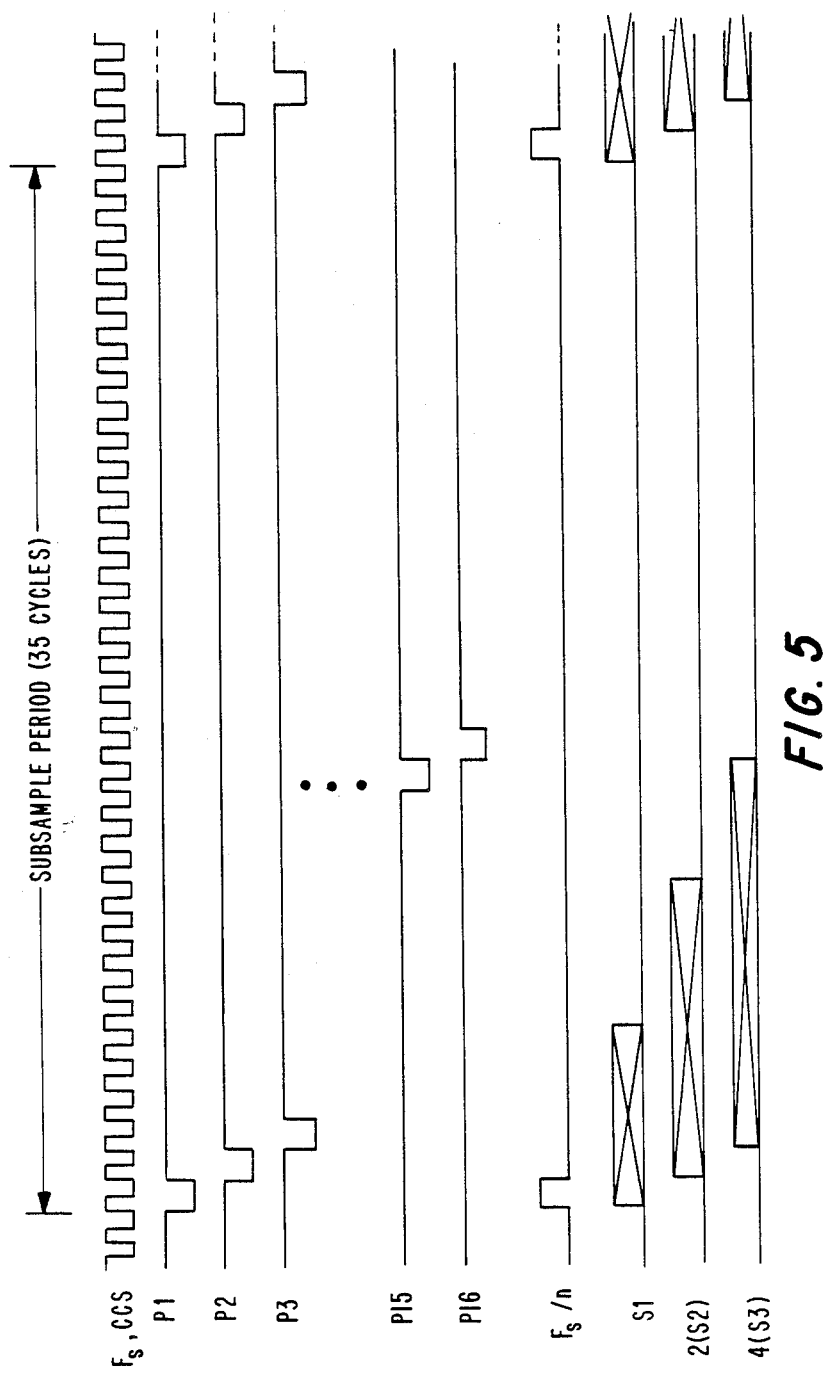
FIG. 5 includes clocking waveforms useful in describing the apparatus shown in FIGS. 2-4.

Referring back to FIG. 2, the plurality of adders 52 are coupled in parallel with the carry-out terminal CO of one adder circuit coupled to the carry-in terminal, CI, of the adjacent adder circuit. The carry-in terminal of the leftmost adder circuit 520 is coupled to a logic zero valued potential. The addend input terminal A of adder circuit 520 is coupled to the input terminal 50. The respective addend input terminals, A, of the remainder of the adder circuits 521-525 in element 52 are coupled to a logic zero potential. The strobed data output terminals, SDO's, of all of the adder circuits 520-525 are coupled to a common output bus 70 on which the signal S1 is generated. The data output terminals, DO, of the respective adder circuits are coupled to respective addend input terminals, A, of a second plurality of adder circuits 53. The strobe input terminals of adder circuits 520-525 are coupled to output connections P1-P6 respectively of a serial-input-parallel-output shift register 59. Shift register 59 is clocked at the oversample rate $f_s$. Signal $F_s/n$, of duration $1/f_s$, is applied to the serial input terminal of the register every n input sample periods. The inverse of the signal $F_s/n$ is successively output on the ordinally increasing numbered output terminals P1-P16 (see FIG. 5).

The input pulse applied to register 59 is timed so that the negative going pulses occur on outputs P1, P2 etc. respectively during the first, second etc. input sample periods of each group of n input samples. These pulses successively reset the respective adder stages 520-525, and simultaneously successively strobe the data contained in the respective latches 77 onto the output connection 70 in bit-serial format with the least significant bit, LSB, occurring first and most significant bit, MSB, occurring last. Since the input values are either logic highs or logic lows, the bit-serial output will be in unsigned binary format. Subsequent to the data bit being strobed out of adder 525 by pulse P6, the output connection 70 is clamped to a logic low value. This clamping function is performed by set-reset flip flop 56 and the gated buffer 58. Responsive to a pulse P7, from shift register 59, the flip flop 56 conditions the gated buffer 58 to pull the connection 70 low and responsive to a pulse P1, flip flop 56 conditions gated buffer 58 to a high impedance state for the period of six input samples, permitting the accumulated value in element 52 to be read out.

The data output terminals, DO, of element 52 are coupled to respective addend input terminals, A, of element 53 which comprises adder circuits 530-539. Adder circuits 530-539 are identical to the adder circuit illustrated in FIG. 3 and are interconnected in a similar manner as adder circuits 520-525 in element 52, except that there is a multi-bit addend input and a greater number of stages to accommodate larger sums. In addition, the strobe pulses applied to the first and successive stages of element 53 are delayed by one sample period relative to the strobe pulses applied to the first and successive stages of element 52. The strobed data output terminals of elements 530-539 are coupled to the output connection 72. Flip flop 60 and gated buffer 62 are incorporated to pull output connection 72 low for the period beginning subsequent to data being strobed out of adder circuit 539 and the next occurrence of a pulse on terminal P2 of shift register 59.

The data output terminals, DO, of adder circuits 530-539 are coupled to respective successive adder circuit addend input terminals, A, of element 54. Element 54 comprises a plurality of adder circuits connected similar to the adder circuits of elements 52 and 53 except that a still larger number of adder circuits are employed to accommodate still large accumulated values. In addition tee strobe pulses applied to the first and successive adder circuits of element 54 are delayed one sample period relative to the strobe pulses applied to the first and successive adder circuits of element 53. The strobed data output terminals, SDO, of the respective adder circuits of element 54 are coupled to the output connection 74.

Element 52 is configured as a single bit incrementor, that is, it increments the value stored internally by the value of the single bit input. Having six stages element 52 is an accumulator for up to $2^6-1$ one bit input samples.

Element 53 is a multi-bit incrementor. Element 53 increments the value stored internally with the successive values provided by element 52. Similarly element 54 is a multi-bit incrementor arranged to accumulate the successive values provided by element 53.

The sum output and carry output of each adder circuit is coupled to the respective output terminals DO and CO through respective latch circuits 77 and 76. This creates a one sample period propagation delay in each adder circuit. Thus there is a latency between the application of a sample to be accumulated and the occurrence of the respective accumulated value. Since there are similar delays in each of the elements 52, 53 and 54, the data output by element 52 is properly time aligned for acceptance by element 53, and data output by element 53 is properly time aligned for acceptance by element 54 with the ordering of the sequence of strobe pulses as indicated. Further, because of the latency in producing the accumulated values, the respective adder circuits in each of the elements 52-54, may be successively strobed to generate bit-serial accumulated values without loss of any data generated within the element. Finally, since the adder circuits are successively reset at the oversample rate, while the data is being read out of the accumulators, there is no loss of input samples, i.e., no contention between the accumulation function and the data read out function.

Note however that there is a one sample delay between the input to element 52 and the output of element 52, the input to element 53 and the output of element 53 and the input of element 54 and the output of element 54 with respect to the LSB of the accumulated values. To accommodate for these delays, element 53 is strobed one sample period later than element 52 and element 54 is strobed one sample period later than element 53. Thus the LSB and successive bits of the accumulated value generated by element 52 occur one and two clock periods earlier than the LSB's and successive bits of the accumulated values generated by elements 53 and 54 respectively. This difference in timing effects a bit shift of one and two significant positions of the values provided by elements 53 and 54, respectively relative to the value provided by element 52. Because of these timing differences the outputs on connections 70, 72 and 74 correspond to the values S1, 2 times S2 and 4 times S3 relative to the accumulated values S1, S2, S3 generated by the FIG. 1 circuit.

The signals S1, 2·S2 and 4·S3 are coupled to exemplary scaling and combining circuitry illustrated in FIG. 4. The FIG. 4 circuitry has been designed for a 35:1 subsampling/filter system. The weighting factors $n(n-1)/2$, $n(n+1)/2$ and n are exact for n=35.

The circuit elements in FIG. 4 operate in a clocked mode, synchronous with the oversampling clock $F_s$. The adders and subtractors 108, 114, 116, 120-124, 128, 132-136 and 140-144 are one bit serial adders and subtractors which are clocked continuously with the signal $F_s$. These adders and subtractors impose a one sample delay between application of a pair of input bits and the output of a sum or difference bit. Elements 100, 102, 104, 118, 130 and 138 are delay elements which delay applied samples by 2, 1, 1, 4, 4, and 4 periods of the clock $F_s$ respectively. These delay elements are also clocked by the signal $F_s$. Elements 112 and 126 are each 35-stage serial shift registers. Shift register 110 is a 28-stage serial shift register. Shift registers 110, 112 and 126 are clocked by a continuous signal CCS having a cycle period of $1/f_s$. Shift registers 126 and 112 correspond to the delay elements 29 and 33 of FIG. 1 respectively. Shift register 110 is included to normalize the output signal.

The respective weighting circuits illustrated in FIG. 1 are realized in merged form in the FIG. 4 circuitry. Weighting is performed by the process of adding or subtracting relatively delayed versions of respective samples. Delaying a bit-serial sample by b bit periods has the effect of bit shifting the sample bits to b bit positions of more significance relative to the undelayed sample. Relative to the undelayed sample, the delayed sample has a value of $2^b$ times the value of the undelayed sample. Thus if a sample, S, and a delayed version of that sample ($2^b$S) are added or subtracted, the sum and difference values will be $S(1+2^b)$ and $S(1-2^b)$ respectively. However since the adders and subtractors in FIG. 4 have inherent 1-bit delays, the corresponding sums and differences provided by these elements are $2^1S(1+2^b)$ and $2^1S(1-2^b)$ or $S(2+2^{b+1})$ and $S(2-2^{b+1})$ respectively. The timing datum used to establish the relative weighting of samples is the occurrence of the LSB of signal S1 or the occurrence of signal P1.

Remembering that the signals applied to the FIG. 4 circuitry from the FIG. 2 circuitry are S1, two times S2 and four times S3, it can be demonstrated that the output S144 of subtractor 144, and the output S124 of adder 124 are $$S124=S1(2^5+2^6+2^9+2^{11}+2^{14})-S2(2^5+2^6+2^{10})+S3(2^5) \quad (7)$$

$$S144=S1(2^6+2^7+2^9+2^{10}+2^{11}+2^{14})+S2(2^5+2^6+2^{10})-2^6S3. \quad (8)$$

Signal S144, and signal S124 delayed one subsample period by shift register 126, are combined in adder 128 which produces the signal S128 given by $$S128=2(S144+S124Z^{-1}) \quad (9)$$

The signal 4(S3), delayed by four bit periods in delay elements 100, 102 and 104, is combined in adder 108 with signal S128, delayed by one subsample period in shift register 112, to produce the signal S108 given by $$S108=2[4S3(2^4)+S128\ Z^{-1}] \quad (10)$$

If equations 7-9 are substituted into equation 10, it will be seen that the signal S108 is greater than the desired signal value by a factor of $2^7$. Signal S108 is caled by the factor $2^{-7}$ by applying it to the 28 stage shift register 110 and treating the output signal samples from shift register 110 as being delayed by one subsample period. Relative to the timing datum selected for the LSB of respective samples, the delay of 28 clock periods has the effect of advancing the bits of the output samples to seven significant bit positions of lesser significance. Shifting the sample bits to seven positions of lesser significances produces a scaling of the sample by $2^{-7}$.

In the exemplary system described with respect to FIGS. 2–4, the adders, substractors and delay elements 100–106, 130 and 138 will all contain zero values at the end of each subsample period. However other arrangements may be configured in which corresponding elements may contain residual values. In this instance it will be necessary to provide means to reset these circuit elements to zero immediately prior to the beginning of each subsample period. One skilled in the art of circuit design will readily be able to incorporate such a reset function.

The exemplary embodiment in FIG. 2 is shown having a single bit input connection. This may be expanded to a multi-bit parallel bit input connection with the LSB of the input signal coupled to the leftmost adder circuit 520 and bits of increasing significance coupled in ascending order of the ordinal numbering of the adder circuits in element 52. The numbers of parallel connected adder circuits in elements 52, 53 and 54 will of course be adjusted to accommodate the expected maximum accumulated values.

What is claimed is:

1. Apparatus for filtering and subsampling a sample data signal occurring at a first rate $f_s$ to produce samples at a second rate $f_s/n$, n an integer, said apparatus comprising:

an input terminal for receiving said sampled data input signal;

a compound accumulator, coupled to said input terminal, for providing first output values corresponding to the accumulated values of successive input samples of exclusive groups of n input samples of said input signal, second output values corresponding to a double accumulation of values of successive input samples of said exclusive groups of n input samples, and third output values corresponding to a triple accumulation of values of successive input samples of said exclusive groups of n input samples;

first means coupled to said compound accumulator for combining said first, second and third output values in the ratio $n(n-1)/2:-n:1$ to produce a first combined signal FCS1;

second means coupled to said compound accumulator for combining said first, second and third output values in the ratio $n(n+1)/2:n:-2$ to produce a second combined signal FCS2;

third means coupled to said compound accumulator and to said first and second means, for providing said signal FSC2 delayed by one subsample period and said signal FCS1 delayed by two subsample periods, and for combining said third output values with said signal FCS2 delayed by one subsample period and said signal FCS1 delayed by two subsample period.

2. The apparatus set forth in claim 1 wherein aid compound accumulator comprises the cascade connection of three accumulator circuits.

3. The apparatus set forth in claim 2 wherein said third means comprises:

first delay means, coupled for receiving said signal FCS1, for delaying signal FCS1 by a period of $n/f_s$ seconds;

summing means, coupled to said first delay means, for combining delayed representations of signal FCS1 with signal FCS2;

second delay means, coupled to said summing means, for delaying signal provided by said summing means by a period of $n/f_s$ seconds;

further summing means coupled to said second delay means and said compound accumulator for combining said third output values with delayed signal provided by said second delay means.

4. The apparatus set forth in claim 1 wherein said third means comprises:

first delay means, coupled for receiving said signal FCS1, for delaying signal FCS1 by a period of $n/f_s$ seconds;

summing means, coupled to said first delay means, for combining delayed representations of signal FCS1 with signal FCS2;

second delay means, coupled to said summing means, for delaying signal provided by said summing means by a period of $n/f_s$ seconds;

further summing means coupled to said second delay means and said compound accumulator for combining said third output values with delayed signal provided by said second delay means.

5. Apparatus for filtering and subsampling a sampled data signal occurring at a sample rate $f_s$, to produce samples at a rate $f_s/n$ where n is an integer, said apparatus comprising:

an input terminal for receiving said sampled data signal;

a cascade connection of first, second and third accumulators, said first accumulator being coupled to said input terminal for providing first intermediate accumulated values of successive input samples and providing first accumulated output values corresponding to the accumulated values of successive input samples in exclusive groups of n successive samples, said second accumulator being coupled to said first accumulator for providing second intermediate accumulated values of said first intermediate accumulated values and for providing second accumulated output values corresponding to the accumulated value of successive first intermediate accumulated values over each exclusive group of n samples, and said third accumulator being coupled to said second accumulator for providing third accumulated output values corresponding to the accumulated value of successive second intermediate accumulated values over each exclusive group of n samples;

first means coupled to said first, second and third accumulators for combining said first, second and third accumulated output values in the ratio $n(n-1)/2:-n:1$ to generate a first combined signal FCS1;

second means coupled to said first, second and third accumulators for combining said first, second and third accumulated output values in the ratio $n(n+1)/2:n:-2$ to generate a second combined signal FCS2;

third means coupled to said first and second means and said third accumulator for combining said third accumulated output signal, and said signals FCS1 and FCS2 to produce a filtered, subsampled signal.

6. The apparatus set forth in claim 5 wherein said third means comprises means for providing said signal FCS2 and FCS1 delayed by one and two subsample periods respectively and, for combining said third accumulated output value with said signal FCS2 delayed by one subsample period and with said signal FCS1 delayed by two subsample periods.

7. Bit-serial apparatus for filtering a sampled data signal, including an accumulator comprising:
   sampled data input port for receiving said sampled data signal, and a serial output port;
   a plurality of adder circuits each having carry-input, carry-output, addend input, augend input and sum data terminals, and including means for selectively coupling said sum data terminal or a reference value to said augend input terminal;
   means for connecting N, an integer, of said adder circuits in parallel wherein said adder circuits are ordinally numbered one to N, the carry input terminal of adder circuit numbered one being coupled to a reference value and the carry output terminal of each adder circuit being connected to the carry-input terminal of the next higher ordinally numbered adder circuit, the addend input terminal of at least adder circuit numbered one being coupled to said sampled data input port, and the addend input terminals of adder circuits which are not coupled to said sampled data input port being coupled to a reference value; and
   means for successively coupling in the order of ordinal numbering of adder circuits, the respective sum data terminals to said serial output port.

8. The bit-serial apparatus set forth in claim 7 wherein said accumulator further includes
   means for connecting M of said adder circuits in parallel, M an integer greater than N, wherein said M adder circuits are ordinally numbered one to M, the carry input connection of adder circuit numbered one being coupled to a reference value and the carry output connection of each adder circuit being connected to the carry input connection of the next higher ordinally numbered adder circuit, the addend input connections of the first N of the M parallel connected adder circuits beng coupled to the sum data terminals of the N parallel connected adder circuits according to their corresponding ordinal numbering, the addend input connections of the remaining M parallel connected adder circuits which are not connected to the sum data output terminals of the N parallel connected adder circuits being respectively connected to a reference value;
   a further serial output port; and
   means for successively coupling in the order of ordinal numbering of adder circuits, the respective sum data terminals to said further serial output port.

9. Bit-serial apparatus for filtering a sampled data signal, including an accumulator comprising;
   an input port for receiving said sampled data signal;
   a plurality of adder circuits, each of said adder circuits being a one-bit adder having carry-input, carry-output, addend input, augend input, data output, strobe input and strobed data output terminals, said adder providing a carry output signal to said carry output terminal and a sum output signal to said data output terminals, said adder circuit further including first and second gating means having respective control input connections coupled to said strobe input terminal, and having respective input terminals coupled to receive said sum output signal, said first gating means coupled said sum output signal to said strobed data output terminal responsive to a first state of a strobe signal and exhibiting high impedance responsive to a second state of said strobe signal, said second gating means coupled said sum output signal to said augend input terminal responsive to said second state of said strobe signal and coupling a zero value to said augend input terminal responsive to said first state of said strobe signal,
   means for connecting N (an integer) of said adder circuits in parallel wherein said adder circuits are ordinally numbered one to N, the carry input terminal of adder circuit numbered one being connected to a logical zero value and the carry output terminal of each adder circuit being connected to the carry input terminal of the next higher ordinally numbered adder circuit, the strobed data output terminals being coupled to a first common output bus, the addend input terminal of at least one of said N adder circuits being coupled to said input port and the addend input terminals of the remaining adder circuits, which are not connected to said input port, being coupled to a logical zero value; and
   means for generating a plurality of bistate signals, coupled to respective strobe input terminals of said adder circuits for successively strobing said adder circuits in ascending order of their ordinal numbering.

10. The bit-serial apparatus set forth in claim 9 wherein said accumulator further includes
    means for connecting M of said adder circuits in parallel, M an integer greater than N, wherein said M adder circuits are ordinally numbered one to M, the carry input terminal of adder circuit numbered one being coupled to a logical zero value and the carry output terminal of each adder circuit being connected to the carry input terminal of the next higher ordinally numbered adder circuit, the strobed data output terminals being coupled to a second common output bus, the addend input terminals of the first N of the M parallel connected adder circuits being coupled to the data output terminals of the N parallel connected adder circuits according to their corresponding ordinal numbering, the addend input terminals of the remaining M parallel connected adder circuits which are not connected to the data output terminals of the N parallel connected adder circuits being respectively connected to a logical zero value, and
    means for coupling the strobe terminals of said M parallel connected adder circuits to said means for generating a plurality of bi-state signals such that said M parallel connected adder circuits are strobed in ascending order of their ordinal numbering.

11. The bit-serial apparatus set forth in claim 9 wherein each of said adder circuits further includes:
    means for providing a delay of one input sample period to said sum output signal coupled to said second gating means: and
    means for providing a delay of one input sample period to said carry output signal coupled to said carry output terminal.

12. Bit-serial apparatus for filtering a sampled data signal, including an accumulator comprising:
    a signal input port for receiving said sampled data signal;
    a plurality of single bit accumulators, each of said single bit accumulators having data input, carry input, strobe input, carry output and strobed data output terminals;

means for connecting N (an integer) of said single bit accumulators in parallel wherein said single bit accumulators are ordinally numbered one to N, the carry input terminal of single bit accumulator numbered one being coupled to a logical zero value and the carry output terminal of each single bit accumulator being coupled to the carry input terminal of the next higher ordinally numbered single bit accumulator, the data input terminal of at least one of said N single bit accumulators being coupled to said signal input port and the data input terminals of the remaining single bit accumulators, which are not connected to said signal input port, being coupled to a logical zero value; and means, coupled to said strobe input terminals of said N single bit accumulators, for conditioning said N single bit accumulators to sequentially provide single bit accumulated output data at their respective strobed data output terminals, in a sequence corresponding to an ascending order of their ordinal numbering, a sequence of N single bit accumulated output data from said N single bit accumlators constituting a bit-serial accumulated sample.

* * * * *

UNITED STATES PATENT AND TRADEMARK OFFICE
CERTIFICATE OF CORRECTION

PATENT NO. : 4,819,252

DATED : April 4, 1989

INVENTOR(S): Todd J. Christopher

It is certified that error appears in the above-identified patent and that said Letters Patent is hereby corrected as shown below:

Claim 2, Col. 9, line 58 reads "aid" should read "said"

Claim 8, Col. 11, line 39 reads "beng" should read "being"

Claim 9, Col. 11, line 66 reads "coupled" should read "coupling"

Claim 9, Col. 12, line 3 reads "coupled" should read "coupling"

In the ABSTRACT, line 6 reads "substampled" should read "subsampled"

Signed and Sealed this

Tenth Day of October, 1989

Attest:

DONALD J. QUIGG

Attesting Officer

Commissioner of Patents and Trademarks